United States Patent [19]

Sellers

[11] Patent Number: 5,770,023

[45] Date of Patent: Jun. 23, 1998

[54] ETCH PROCESS EMPLOYING ASYMMETRIC BIPOLAR PULSED DC

[75] Inventor: Jeff C. Sellers, Palmyra, N.Y.

[73] Assignee: ENI A Division of Astec America, Inc., Rochester, N.Y.

[21] Appl. No.: 600,194

[22] Filed: Feb. 12, 1996

[51] Int. Cl.$^6$ .................................................. C23C 14/34
[52] U.S. Cl. ................................. 204/192.3; 204/192.32; 204/192.12; 204/298.08
[58] Field of Search ........................... 204/192.1, 192.12, 204/192.3, 192.32, 192.37, 298.08; 216/67; 156/643.1

[56] References Cited

U.S. PATENT DOCUMENTS

| | | | |
|---|---|---|---|
| 4,693,805 | 9/1987 | Quazi | 204/298.08 |
| 5,102,687 | 4/1992 | Pelletier et al. | 216/67 |
| 5,303,139 | 4/1994 | Mark | 204/298.08 |
| 5,346,600 | 9/1994 | Nieh et al. | 204/192.3 |

FOREIGN PATENT DOCUMENTS 0 564 789  10/1993  European Pat. Off. .

OTHER PUBLICATIONS

Sellers, "Asymmetric Bipolar Pulsed DC", ENI Tech Note, pp. 1–8, Feb. 1992.

*Primary Examiner*—Robert Kunemund
*Assistant Examiner*—Rodney G. McDonald
*Attorney, Agent, or Firm*—Trapani & Molldrem

[57] ABSTRACT

An asymmetric bipolar plasma etching process is employed for etching a workpiece positioned within a plasma chamber, to prepare the workpiece for a subsequent coating process. The etching process involves applying a negative high voltage to the workpiece, relative to an anode portion of the chamber. Pulses of a positive voltage are applied to the workpiece at a predetermined pulse width and a predetermined level relative to the anode, so that the applied voltage appears as a train of asymmetric bipolar pulses. The waveform has a major negative-going portion and a minor positive-going portion. The negative-going portion can have a voltage of minus 300 to minus 4,000 volts, and the positive-going pulses can have a voltage of plus 50 to plus 300 volts, and a typical pulse width between about 0.25 and 3 microseconds. The etching process can be followed by a sputter coating process in the same chamber. Another coating technique could also be used.

10 Claims, 1 Drawing Sheet

ETCH

ETCH

SPUTTER

ETCH PROCESS EMPLOYING ASYMMETRIC BIPOLAR PULSED DC

BACKGROUND OF THE INVENTION

This invention relates to the deposition of thin films and is more particularly concerned with an etching process for preparing workpieces to receive a coating. The process of this invention can be combined with a reactive sputtering process. The combined etching and sputtering process can be employed, for example, for creating dielectric insulating layers on electrical parts, or wear-resistant layers on mechanical parts.

The invention is more specifically directed to an improved dc sputtering process in which the dielectric coating material that becomes lodged on the conductive target is removed, thus avoiding a major cause of arcing.

Reactive sputtering, and problems related to dc sputtering, are described in great detail in my earlier U.S. patent application Ser. No. 08/261,988, filed Jun. 17, 1994, and having a common assignee herewith.

Sputtering is a vacuum deposition process in which a sputtering target is bombarded with ions, typically an ionized noble gas, and the atoms of the target material are mechanically freed by momentum transfer. The target material then coats a nearby substrate.

In a reactive sputtering process a reactive gas is introduced into the deposition chamber, and the freed target material reacts with the reactive gas to form a coating material. For example, the target material can be silicon or tungsten, for example, and a carbonaceous gas, e.g. acetylene, can be used as the reactive gas to produce carbide coatings such as $BC_4$, SiC, WC, etc. Where the target is titanium, ammonia can be introduced to produce a nitride coating such as TiN or TiAlN. In any event, the conductive target atoms and the reactive gas react in plasma in the chamber to produce the compound that serves as a coating. This process is especially useful in hardcoating knife blades, drill bits, milling burs, or other similar tools.

DC sputtering is a random process and the insulating coating material is deposited on all available surfaces. This means that not only does the insulating material coat the article in question, but it also coats other surfaces in the chamber as well, including the target. Unless the workpiece to be coated is completely clean and free of impurities, the sputter coating will coat the impurities and foreign matter as well as the metal surface of the workpiece.

The DC etching process also prepares the workpiece surface to receive the sputtered coating material. The etching process will be unable to remove insulating films or other contaminants on the surface of a conductive body, so DC etching alone cannot prepare the surface in those substrates where there may be oxides present, i.e., insulators or dielectrics. Where oxides remain and etching is not accomplished, there may be poor adhesion of the sputtered hard coating on the surface of the workpiece.

In the hard-coating industry, the problem of surface oxidation is usually addressed by a wet process, i.e., by immersing the substrate in a reagent solution. However, the use of many reagents can have an adverse environmental impact, and thus require expensive environmental control procedures. Alternatively, a long RF etch process can be used to pre-etch the surface for further DC etching. However, RF plasma work is expensive and difficult, requiring much additional equipment such as an RF matching network. Also, when RF etching is employed with a subsequent DC etching step, separate power supplies are needed for the two stages, and there is a loss of process throughput owing to the need for an additional step. Moreover, the sequential combination of RF and DC etching is a relatively slow process.

To date, no one has been able to combine the DC etching and RF etching process steps into a single step to avoid the need for excess wet cleaning and also to avoid the need for additional plasma generation equipment.

OBJECTS AND SUMMARY OF THE INVENTION

Accordingly, it is an object to provide a straightforward process for cleaning and etching workpieces in one process step, and which avoids the drawbacks of the prior art.

It is another object to reduce the need for wet cleaning of workpieces before etching and sputter coating, thereby avoiding the drawbacks attendant on wet process cleaning.

It is a further object to provide a combined sputter etch process that uses an asymmetric pulsed DC to allow non-conductive films to be cleaned from a workpiece during the etching step to prepare the workpiece for sputter coating.

It is a further object to provide an asymmetric pulsed DC etching process that can be carried out in the same plasma chamber where the subsequent sputter coating process takes place.

In accordance with an important aspect of this invention, an asymmetric bipolar plasma etching process is employed for etching a workpiece positioned within a plasma chamber. This process involves applying a negative high voltage to the workpiece with respect to an anode in the chamber. This causes noble gas ions in the chamber to impinge upon the workpiece with sufficient energy to free impurities from the surface of the workpiece. Then, pulses of a positive voltage are applied to the workpiece at a predetermined pulse width and a predetermined level relative to the anode, so that the voltage applied between the workpiece and the anode is a train of asymmetric bipolar pulses. Preferably, the applied power waveform has a major negative-going portion and a minor positive-going portion, with the negative-going portion having a voltage on the order of minus 1,200 to minus 1,800 volts, and the positive going portion having a voltage on the order of plus 50 to plus 300 volts. The minor positive-going portions are pulses of positive voltage with a typical pulse width of between about 0.25 and 3 $\mu$sec.

The process as described can be applied to a combined etching and sputter coating operation, where the parts to be sputter-coated are first etched and then subjected to a sputter coat process in the same chamber. In the combined etching and sputtering process the article is first subjected to plasma etching. This takes place in a plasma chamber that contains both the articles and a sputtering target. The etching process removes impurities from the surface of the articles, and then the latter are subjected to reactive sputtering to deposit the desired coating on the article. The etching process comprises the steps enumerated above, namely, etching the article in a plasma chamber by (i) applying a negative high voltage between said workpiece and an anode in said chamber at a level that causes noble gas ions in said chamber to impinge upon the workpiece with sufficient energy to free impurities from the surface of the workpiece; while (ii) applying to the workpiece pulses of a positive voltage at a predetermined pulse width and a predetermined level relative to the anode, so that the voltage applied between said workpiece and said anode is a train of asymmetric bipolar pulses. After the articles have been etched sufficiently to prepare them for sputter coating, a reactive sputtering process is carried out in the plasma chamber. Reactive sputtering involves introducing into the chamber a reactive gas; and applying a DC sputtering voltage between the target and the anode in the chamber at a level that causes the noble gas ions in the chamber to impinge upon said target with sufficient energy to free atoms of said target material from said target. The free atoms of the target material react with said reactive gas to form the coating compound, and this compound deposits itself on the etched surface of the article.

A preferential sputtering technique is preferably employed for the reactive sputtering process. This is carried out by applying a negative DC voltage to the target at a predetermined negative voltage level relative to the anode, and periodically applying pulses of a positive voltage to the target relative to said anode at a predetermined rate and predetermined pulse width. This technique ensures that accumulations of the coating compound which have deposited themselves onto the target are bombarded by the noble gas ions, and these ions have sufficient energy to free molecules of the compound from said target. This keeps the target surface free of insulating impurities, and allows the sputtering operation to take place in the superglow region without risk of destructive arcing. Preferably, the pulses of positive voltage have a pulse width between about 0.25 $\mu$sec and 3 $\mu$sec, the negative voltage for sputtering is substantially between 300 and 700 volts, and the positive voltage is substantially between 50 and 300 volts.

The above and many other objects, features, and advantages of this invention will become apparent from the ensuing description of a preferred embodiment, which is to be read in conjunction with the accompanying Drawing.

DETAILED DESCRIPTION OF THE PREFERRED EMBODIMENT

Figure 1:
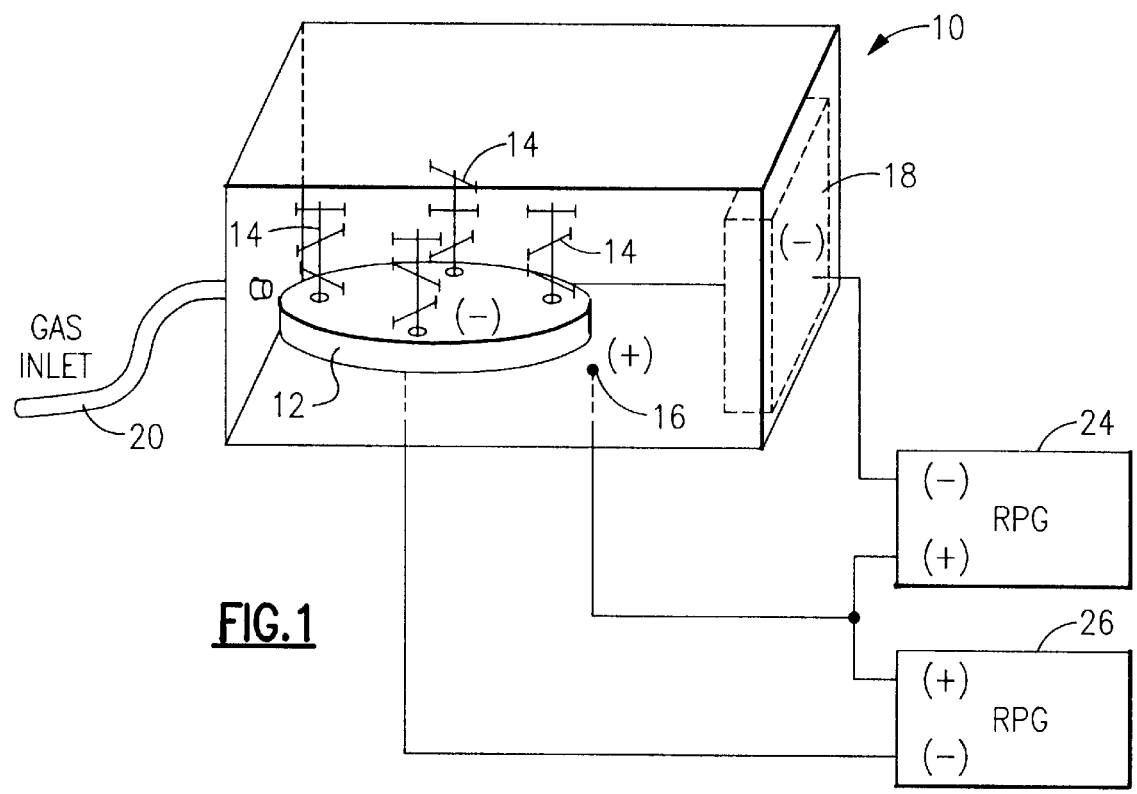
FIG. 1 is a schematic system diagram for explaining plasma etching and sputter coating operations in accordance with an embodiment of this invention.

With reference to the Drawing, FIG. 1 shows diagrammatically a plasma chamber arranged for DC plasma etching and DC reactive sputtering. Here a plasma chamber 10 contains a rotary carousel 12, on which there are several rotary racks or spindles, each holding a number of workpieces 14. The workpieces can be cutting blades, drill bits, or other tools which are to be given a hard coat, for example a coating of titanium nitride or TiN. A conductive member in the chamber 10 serves as an anode 16. A conductive sputtering target 18 is also disposed within the chamber 10, and serves as a source of material for coating. The target can be composed of a metal material, for example titanium. A gas inlet 20 permits a controlled flow of a reactive gas into the chamber 10. This reactive gas can be ammonia, acetylene, $N_2$, $O_2$, or another compound that will react in plasma with the target material, which has been sputtered off from the target to form the coating material. Not shown here are a vacuum system for maintaining the interior of the chamber at a controlled vacuum, and a source of argon or another noble gas which must be present in the chamber to produce the plasma. Shown in block form are a plasma generator, i.e., a power supply 24, which supplies a negative voltage for etching, with a negative lead coupled to the carousel 12 and a positive lead coupled to the anode 16. Another plasma generator or power supply 26 provides sputtering voltage, with a positive lead coupled to the anode 16 and a negative lead coupled to the sputtering target 18. These plasma generators 24 and 26 are shown here as separate elements, but in practice a single plasma generator can be employed for both functions.

Figure 2:
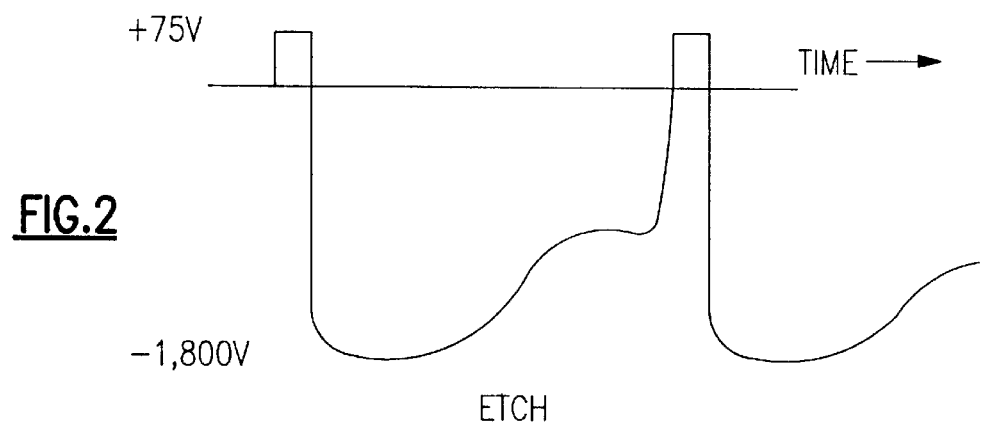
FIG. 2 is a waveform diagram showing the voltage waveform to be applied during an etching operation in accordance with the invention.

Initially, after the workpieces 14 are loaded onto the carousel 12 and the chamber 10 is properly evacuated, a flow of argon (or other noble gas) is started into the chamber, and the plasma generator 24 is actuated. This applies a negative DC voltage on the order of −1,500 to −1,800 volts to the carousel and workpieces, relative to the anode 16. A plasma is struck, and the plasma, which comprises ions of the noble gas, operates on the workpieces 14 to prepare them for a subsequent sputter coating operation. The noble gas ions in the plasma are driven by the electric field into the surface of the workpieces. In order to access any portions of the workpiece surface that are covered with oxide or impurity, it is necessary to remove the same from the workpieces or articles. This is carried out by superimposing positive pulses onto the negative etching voltage, and the resulting waveform for the plasma generator is a shown in FIG. 2. Here, the etching waveform has a major negative portion which occupies a large fraction of the total duty cycle at a voltage of −1,500 to −1800 volts, and a minor positive portion at a voltage of +50 to +300 volts, here about +75 volts. The negative voltage range can be −300 to −4,000 volts. This technique, in effect, superimposes a small amount of AC (bipolar) plasma etching onto a generally DC plasma etching process. The result of this is that oxides are cleaned away from the workpieces during the etching process, but the equipment involved is no more complex than what is needed for dc plasma etching. The wet process cleaning can be omitted.

Figure 3:
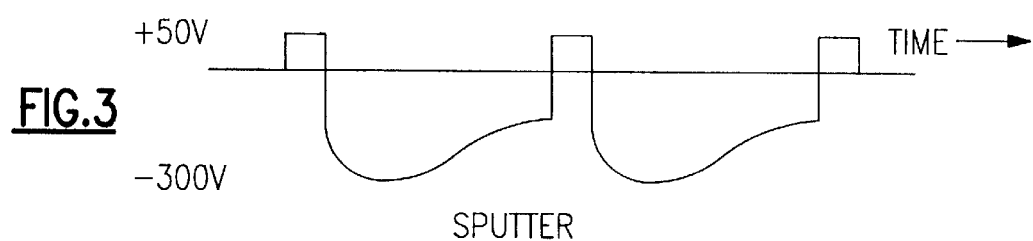
FIG. 3 is a waveform diagram showing the voltage waveform to be applied during a sputtering operation.

After the plasma etching procedure is completed, the sputtering process can begin. This can be carried out in the very same plasma chamber 10, thus eliminating any time delays or handling that would otherwise ensue. The plasma generator 26 is now actuated, and a reverse bias pulse DC plasma voltage is applied to the target 18. The plasma voltage waveform is generally as shown in FIG. 3. This is discussed in detail in my earlier co-pending U.S. patent application Ser. No. 08/261,988, filed Jun. 17, 1994, and having a common assignee herewith. The disclosure of such patent application is incorporated herein by reference.

While the actual voltage applied during the sputtering operation depends on the sputtering target material, the noble gas and reactive gas employed, and geometrical factors, a typical value can be about −300 to −700 volts, with the positive-going pulse rising to about +50 volts. The positive pulse can have a pulse width of 2 $\mu$sec and a repetition rate of 50 KHz. The pulse width can vary between 0.25 $\mu$sec and 3 $\mu$sec, with the repetition rate varying between 40 KHz and 200 KHz. The pulse width and repetition rate employed during plasma etching can be variable over similar ranges.

During this process, the reactive gas is introduced into the chamber 10, and this mixes with the noble gas in the plasma. The atoms of target material that are knocked off the target 18 react with the reactive gas to form molecules of the coating compound. These settle onto the prepared surfaces of the workpieces 14. Some of this compound also finds its way back onto the surface of the target 18, but this is continuously removed from the target by action that is discussed in the above-mentioned U.S. patent application 08/261,988. Practical examples of reactive sputter coating are given in that patent application. The reverse bias (positive) pulses are effective also in removing impurities and inclusions from the target, and also serves to condition the target for improved sputtering. The preconditioning stress experienced in other techniques can actually increase the risk of arcing, so this process also assists in keeping arcing under control.

While the invention has been described with reference to a preferred embodiment, the invention is certainly not limited to that precise embodiment. For example, the etching process can be followed by other coating technologies such as cathodic arc, CVD, or vapor coating. Rather, many modifications and variations would present themselves to persons skilled in the art without departing from the scope and spirit of the invention, as defined in the appended claims.

I claim:

1. Asymmetric bipolar plasma etching process for etching a workpiece to be later coated, and which is positioned within a plasma chamber, comprising the steps of:

applying a negative dc forward etching current at an applied forward voltage level between said workpiece and an anode in said chamber such that said applied forward voltage level causes noble gas ions in said chamber to impinge upon said workpiece with sufficient energy to flee impurities from the surface of said workpiece; and applying onto said forward etching current pulses of a positive reverse voltage at a suitable pulse width and a suitable reverse bias level relative to said anode, so that the voltage applied between said workpiece and said anode is a train of asymmetric bipolar pulses with the reverse bias voltage having a pulse duty cycle that is significantly below 50%;

wherein said applied forward voltage is between negative 300 and negative 4,000 volts and said reverse bias voltage is selected at a smaller level between positive 50 volts and positive 300 volts.

2. Process according to claim 1 wherein said negative voltage is on the order of 1,500 to 1,800 volts.

3. A combined etching and sputtering process in which a workpiece is first subjected to plasma etching in a plasma chamber that contains a sputtering target to remove impurities from the surface of the article, and then is subjected to reactive sputtering to produce a coating on the article; comprising the steps of a) etching said article in a plasma chamber by
i) applying a negative dc forward etching current at an applied forward voltage level between said workpiece and an anode in said chamber such that said forward voltage level causes noble gas ions in said chamber to impinge upon said workpiece with sufficient energy to free impurities from the surface of said workpiece; while ii) applying onto said forward etching current pulses of a positive reverse bias voltage at a suitable pulse width and pulse rate and a suitable reverse bias level relative to said anode, so that the voltage applied between said workpiece and said anode is a train of asymmetric bipolar pulses wherein the positive reverse bias voltage has a pulse duty cycle significantly below fifty percent;

wherein said forward applied voltage is between negative 300 and negative 4,000 volts and said reverse bias voltage is provided at a substantially smaller level between positive 50 volts and positive 300 volts; and with said pulse width being between 0.25 $\mu$sec and 3 $\mu$sec; and directly after said workpiece has been etched sufficiently to carry out a sputter coating operation thereon, b) carrying out a reactive sputtering process in the very same plasma chamber, by
i) introducing into said chamber a reactive gas; and
ii) applying a dc sputtering current between said target and an anode in said chamber at an applied voltage level that causes noble gas ions in the chamber to impinge upon said target with sufficient energy to free atoms of said target material from said target;
iii) wherein the free atoms of said target material react with said reactive gas to form a compound that is then deposited on the etched surface of said workpiece.

4. Combined etching and sputtering process according to claim 3, wherein said step ii) of applying a dc sputtering current includes supplying said sputtering current to said target at a forward negative voltage level relative to said anode, and applying onto said sputtering current pulses of a positive reverse bias voltage relative to said anode at a predetermined pulse rate having a pulse duty cycle that is significantly below fifty percent and a predetermined pulse width so that accumulations of said compound which have deposited on said target are bombarded by said noble gas ions with sufficient energy to free molecules of said compound from said target.

5. Combined etching and sputtering process according to claim 4 wherein said pulses of positive voltage have a pulse width between about 0.25 and 3 $\mu$sec.

6. Combined etching and sputtering process according to claim 4, wherein said negative applied voltage is between 300 and 700 volts and said positive voltage is between 50 and 300 volts.

7. Process according to claim 1 wherein said pulses have a pulse rate of between 40 KHz and 200 Khz.

8. Process according to claim 1 wherein said reverse bias voltage is about +75 volts.

9. Process according to claim 1 wherein said applied forward voltage is at least minus 1,200 volts.

10. Process according to claim 9, wherein said applied forward voltage is between about minus 1,200 volts and minus 1,800 volts.

* * * * *

UNITED STATES PATENT AND TRADEMARK OFFICE
CERTIFICATE OF CORRECTION

PATENT NO. : 5,770,023
DATED : June 23, 1998
INVENTOR(S) : Jeff C. Sellers

It is certified that error appears in the above-identified patent and that said Letters Patent is hereby corrected as shown below:

Column 5, line 28:
    "flee" should read --free--.

Signed and Sealed this

Twentieth Day of October, 1998

Attest:

BRUCE LEHMAN

Attesting Officer      Commissioner of Patents and Trademarks